(12) United States Patent
Wang et al.

(10) Patent No.: US 7,887,928 B2
(45) Date of Patent: Feb. 15, 2011

(54) COATED LEAD FRAME

(75) Inventors: Chao Wang, Tianjin (CN); Qing Chun He, Tianjin (CN); Zhe Li, Tianjin (CN); Zhijie Wang, Tianjin (CN); Dehong Ye, Tianjin (CN)

(73) Assignee: Freescale Semiconductor, Inc, Austin, TX (US)

( * ) Notice: Subject to any disclaimer, the term of this patent is extended or adjusted under 35 U.S.C. 154(b) by 459 days.

(21) Appl. No.: 12/129,686

(22) Filed: May 30, 2008

(65) Prior Publication Data

US 2009/0111220 A1 Apr. 30, 2009

(30) Foreign Application Priority Data

Oct. 29, 2007 (CN) .................. 2007 1 0184806

(51) Int. Cl.
*B32B 15/01* (2006.01)
*C25D 5/48* (2006.01)
(52) U.S. Cl. .............. 428/615; 428/546; 428/637; 257/778; 257/738; 257/737
(58) Field of Classification Search ............... 427/98, 427/8, 304, 305; 428/615, 546, 637; 437/209, 437/211, 220; 257/778, 738, 737
See application file for complete search history.

(56) References Cited

U.S. PATENT DOCUMENTS

| | | | |
|---|---|---|---|
| 5,436,082 A | | 7/1995 | Mathew |
| 5,459,103 A | * | 10/1995 | Kelleher et al. ............. 205/125 |
| 5,510,197 A | | 4/1996 | Takahashi et al. |
| 5,728,285 A | | 3/1998 | Mathew |
| 5,882,955 A | | 3/1999 | Huang et al. |
| 5,914,532 A | | 6/1999 | Akagi et al. |
| 6,130,027 A | | 10/2000 | Hamada |
| 6,181,009 B1 | | 1/2001 | Takahashi et al. |
| 6,203,931 B1 | | 3/2001 | Chu et al. |
| 6,246,106 B1 | | 6/2001 | Sugimoto et al. |
| 6,268,647 B1 | | 7/2001 | Takahashi et al. |
| 6,299,932 B1 | | 10/2001 | Mihara |
| 6,309,698 B1 | | 10/2001 | Uesugi et al. |
| 6,395,583 B1 | | 5/2002 | Kubara et al. |
| 6,399,220 B1 | | 6/2002 | Abys et al. |
| 6,491,043 B2 | * | 12/2002 | Mohindra et al. .......... 134/25.4 |
| 6,521,358 B1 | | 2/2003 | Tanaka et al. |
| 6,733,823 B2 | * | 5/2004 | Lee et al. ...................... 216/13 |
| 7,087,315 B2 | * | 8/2006 | Matsuo et al. .............. 428/615 |
| 2002/0027294 A1 | * | 3/2002 | Neuhaus et al. ............. 257/778 |

OTHER PUBLICATIONS

Lee, C.; Hoesler, W.; Cerva, H.; Von Criegern, R.; Parthasarathi, A. A Novel High Performance Adhesion enchancing Zn-Cr leadframe coating for popcorn prevention. IEEE Transactions on Advance Pacakging, vol. 22, Issue 3, Aug. 1999, pp. 398-406.

* cited by examiner

*Primary Examiner*—Mary Wilczewski
*Assistant Examiner*—Telly D Green
(74) *Attorney, Agent, or Firm*—Charles Bergere

(57) ABSTRACT

A lead frame having a coating of organic compounds on its lead fingers prevents tin and flux from contaminating the lead fingers after die attach. The coating is removed prior to wire bonding. The coating allows for reliable second bonds (bond between wires and lead fingers) to be formed, decreasing the likelihood of non-stick and improving wire peel strength.

6 Claims, 2 Drawing Sheets

COATED LEAD FRAME

BACKGROUND OF THE INVENTION

The present invention relates to the packaging of integrated circuits (ICs) and more particularly to coating the leads of a lead frame to prevent contamination of the leads during the die attach process.

In many types of semiconductor packages, especially those for high power devices, an integrated circuit die is attached to a die pad of a lead frame with solder paste and then pads on the die are electrically connected to lead fingers of the lead frame with wires. The solder paste is used in order to enhance reliability and thermal conductivity. However, when the die is attached to the die pad, some flux may be deposited on the lead fingers, such as during a reflow operation, causing the formation of tin clouds on the lead fingers. The flux and tin clouds can compromise the subsequent bond between the wire and the lead fingers, leading to bonds that don't stick or a bond with a low peel strength.

It would be advantageous to be able to attach a die to a lead frame with solder paste but not compromise the integrity of subsequent wire bonds to the lead fingers of the lead frame.

BRIEF DESCRIPTION OF THE DRAWINGS

The following detailed description of preferred embodiments of the invention will be better understood when read in conjunction with the appended drawings. The present invention is illustrated by way of example and is not limited by the accompanying figures, in which like references indicate similar elements. It is to be understood that the drawings are not to scale and have been simplified for ease of understanding the invention.

DETAILED DESCRIPTION OF THE INVENTION

Figure 1:
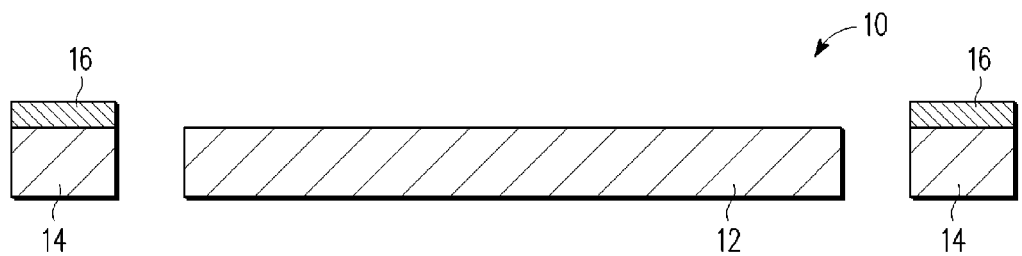
FIG. 1 is an enlarged cross-sectional view of a lead frame with a coating disposed on lead fingers thereof in accordance with an embodiment of the present invention.

The detailed description set forth below in connection with the appended drawings is intended as a description of a presently preferred embodiment of the invention, and is not intended to represent the only form in which the present invention may be practiced. It is to be understood that the same or equivalent functions may be accomplished by different embodiments that are intended to be encompassed within the spirit and scope of the invention. In the drawings, like numerals are used to indicate like elements throughout.

In one embodiment, the present invention provides a method of preparing a lead frame prior to attaching a semiconductor die to a die flag of the lead frame. The method includes the steps of washing the lead frame in an acid bath; performing a first water rinsing operation on the acid washed lead frame; neutralizing the acid on the rinsed lead frame; performing a second water rinsing operation on the lead frame; disposing a coating solution on the lead fingers of the lead frame; performing a third rinsing operation on the coated lead frame; and drying the rinsed, coated lead frame.

In another embodiment, the present invention provides a method of packaging a semiconductor integrated circuit, including the steps of providing a lead frame having a coating of organic compounds at least on lead fingers of the lead frame; attaching the semiconductor integrated circuit to a die flag of the lead frame using solder; performing a solder reflow operation on the lead frame and die attached thereto, wherein during said reflow operation, tin and flux contact the coated lead fingers; and removing the coating from the lead fingers, wherein removing said coating removes the tin and flux from the lead fingers.

A method of attaching a semiconductor integrated circuit or integrated circuit die to a lead frame will now be described with reference to FIGS. 1-3.

FIG. 1 shows a lead frame 10 including a die flag 12 and a plurality of lead fingers 14. The die flag 12 is generally square shaped and sized to receive a semiconductor integrated circuit die. As is understood by those of skill in the art, the lead fingers 14 can surround the die flag 12 on either one, two, three or four sides. The lead frame 10 may be constructed of a conductive metal, such as copper and plated, for example, with Nickel, Palladium and Gold, as is known in the art. The lead frame 10 may be formed by cutting or stamping a metal foil and then plating the foil. Typically, multiple lead frames are formed simultaneously, such as an array of lead frames formed from a single foil sheet.

In accordance with the present invention, the leads 14 of the lead frame 10 include a coating 16 on at least an upper surface thereof. The coating 16 is made of materials such that the coating 16 has good adhesion with the metal and/or plating of the lead frame, and does not permit solder flux and Tin, which may be inadvertently deposited on the lead fingers 14, to seep through the coating 16 and contact the lead fingers 14. Further, the coating 16 is readily dissolved with a de-coating operation, such as with a flux cleaning solution. In one embodiment, the coating 16 comprises a solution of organic compounds, including about 5.5% cationic surfactants and 93.5% non-hazardous compounds. In one embodiment, the coating is formed of non-hazardous compounds, such as Alkyl-alkene, Aryl-hydrocarbon and relative ramifications, Ester, Oxygenous compounds (organic acid, etc.) and other atomic organic compounds, and cationic surfactants, such as Poly(methyl(γ-(2-hydroxyl-3-N,N-dimethyl-N-benzyl ammonium chloride))-propyl)siloxane.

Figure 2:
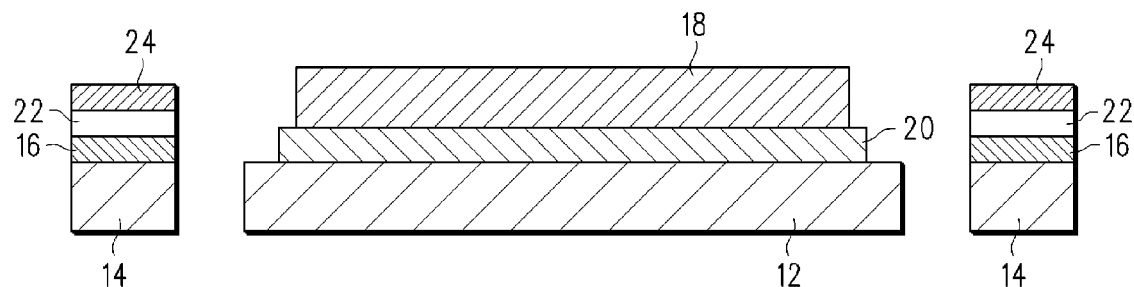
FIG. 2 is an enlarged cross-sectional view of the lead frame of FIG. 1 with contamination layers thereon.
Figure 3:
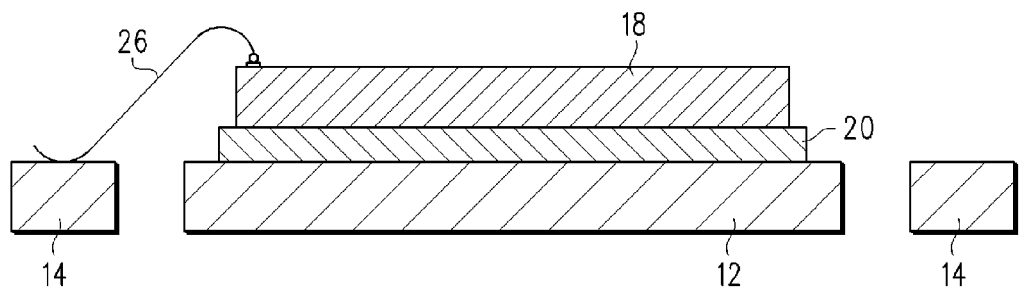
FIG. 3 is an enlarged cross-sectional view of the lead frame of FIG. 2 with the coating and contamination removed from the lead fingers and a die attached to a die pad thereof.

FIG. 2 shows a semiconductor die 18 attached to the die flag 12 with solder 20. As is known in the art, high power circuits often are attached to a die flag using solder. Unfortunately, after a solder reflow operation of the die attach process is performed, flux and tin are deposited on the lead fingers and tin clouds are formed on the lead fingers. FIG. 2 shows such tin clouds 22 and flux 24 on the lead fingers 14. Note that with the coating 16, the tin clouds 22 and flux 24 do not contact at least the upper surface of the lead fingers 14. That is, the coating 16 does not prevent formation of the tin clouds 22, but the coating 16 allows the tin clouds 22 to be removed during a flux cleaning operation.

In order to allow for good bonds to be formed between wires (not shown) and the lead fingers, such as by a wire bonding process, the tin clouds 22 and flux 24 are removed prior to wire bonding. FIG. 3 shows the lead fingers 14 with the coating 16, tin clouds 22 and flux 24 removed therefrom. The coating 16, tin clouds 22 and flux 24 may be removed from the lead fingers 14 with a de-coating process. The de-coating process involves a cleaning process that uses a cleaning solution that dissolves the coating 16 so that the tin clouds 22 and flux 24 are removed. Once the coating 16, tin clouds 22 and flux 24 are removed from the lead fingers 14, a wire bonding operation is carried out to attach wires 26 between bonding pads on the die 18 and respective ones of the lead fingers 14.

Figure 4:
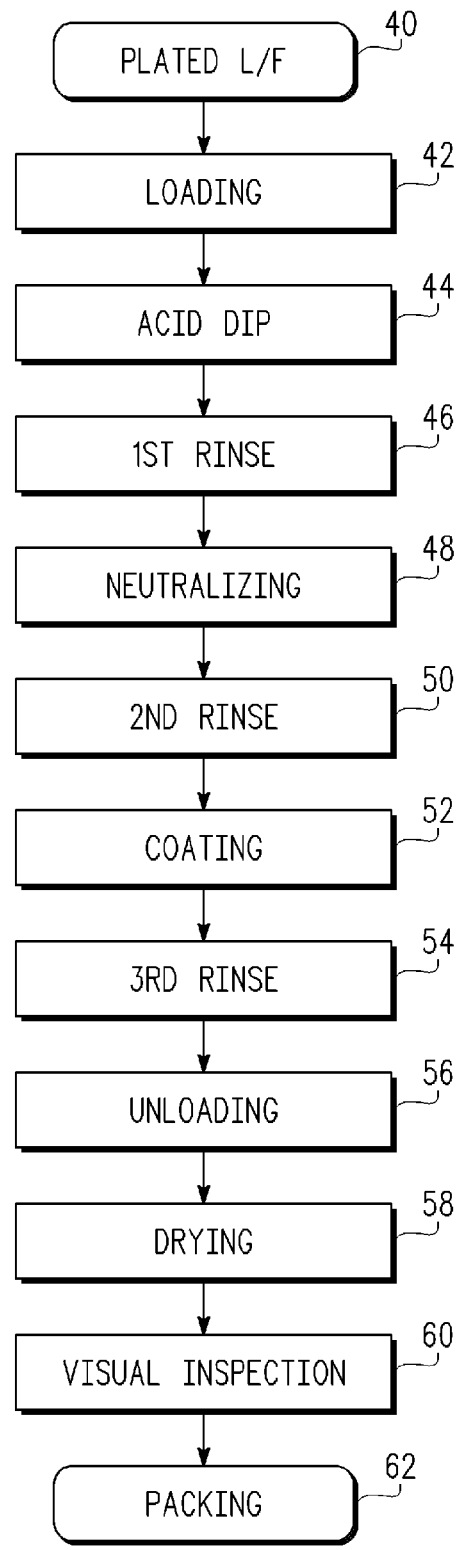
FIG. 4 is a flow chart of a process for coating a lead frame in accordance with an embodiment of the present invention.

Referring now to FIG. 4, a method of preparing a lead frame prior to attaching a semiconductor die to a die flag of the lead frame is shown. At step 40, a plated lead frame, such as one formed of copper and plated with Nickel, Palladium and Gold, is provided. As discussed above, an array of lead frames may be formed simultaneously from a conductive metal, such as from a copper sheet or copper foil. At step 42 the lead frame is loaded into a frame that holds the lead frame for subsequent processing.

First, at step 44, the lead frame is dipped into an acid bath in order to remove the oxides The acid may be hydrochloric acid and the lead frame may be dipped bath for about 60 seconds. After the lead frame is removed from the acid bath, at step 46 a first water rinsing operation is performed, preferably with de-ionized water. At step 48, the lead frame is dipped into ammonia in order to neutralize any remaining acid and then at step 50 a second water rinsing operation is performed on the lead frame, again preferably with de-ionized water.

At step 52, the lead fingers of the lead frame are coated with a material that will prevent tin clouding and flux from contaminating the lead frame during a later die attach process. The coating material, as discussed above, comprises a solution of organic compounds, and in one embodiment, the coating comprises about 95% non-hazardous compounds and about 5% cationic surfactants. Then at step 54, a third rinsing operation is performed on the lead frame, again, preferably with de-ionized water.

At step 56, the lead frame(s) are removed from the frame and at step 58, a drying operation is performed. The lead frames may be dried by nitrogen gas at 75 degrees. After drying, at step 60, a visual inspection is performed to check for if there are any defects. The visual inspection step may be performed by machine or operator. Finally, at step 62, the lead frame is packed until such time as it is used in the chip packaging process.

As is evident from the foregoing discussion, the present invention provides a coated lead frame and a method of preparing a coated lead frame that is especially useful for packaging high power circuits. In one embodiment, the coated lead frame is used for forming a power quad flat no-lead (PQFN) packaged device. The present invention allows for improved wire to lead finger bonds and therefore, improved overall package reliability.

The description of the preferred embodiments of the present invention have been presented for purposes of illustration and description, but are not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiments disclosed, but covers modifications within the spirit and scope of the present invention as defined by the appended claims.

The invention claimed is:

1. A method of preparing a lead frame prior to attaching a semiconductor die to a die flag of the lead frame, the method comprising:
   - washing the lead frame in an acid bath;
   - performing a first water rinsing operation on the acid washed lead frame;
   - neutralizing the acid on the rinsed lead frame;
   - performing a second water rinsing operation on the lead frame;
   - disposing a coating solution on the lead fingers of the lead frame;
   - performing a third rinsing operation on the coated lead frame; and
   - drying the rinsed, coated lead frame.

2. The method of claim 1, wherein the coating solution comprises a solution of organic compounds.

3. The method of claim 2, wherein the coating solution comprises about 95% non-hazardous compounds and about 5% cationic surfactants.

4. The method of claim 1, wherein prior to said acid washing step, the lead frame has been plated with at least one of Nickel, Palladium and Gold.

5. The method of claim 1, wherein the first, second and third water rinsing operations are performed using de-ionized water.

6. The method of claim 1, wherein the neutralizing step comprises dipping the lead frame in ammonia.

* * * * *